United States Patent [19]

Baney et al.

[11] Patent Number: 5,026,684

[45] Date of Patent: Jun. 25, 1991

[54] PROCESS FOR PREPARING CERAMIC SUPERCONDUCTIVE SUBSTANCES

[75] Inventors: Ronald H. Baney, Midland, Mich.; Shin-ichi Hirano, Aichi, Japan

[73] Assignees: Dow Corning Corporation, Midland, Mich.; Shin-Ichi Hirano, Aichi, Japan

[21] Appl. No.: 336,935

[22] Filed: Apr. 12, 1989

Related U.S. Application Data

[63] Continuation-in-part of Ser. No. 254,636, Oct. 7, 1988, abandoned.

[30] Foreign Application Priority Data

Oct. 13, 1987 [JP] Japan .................................. 62-256449

[51] Int. Cl.$^5$ .................... H01L 39/12; B05D 3/02
[52] U.S. Cl. .................... 505/1; 252/521; 423/593; 505/734; 505/735
[58] Field of Search ................ 505/734, 735, 1; 423/593; 252/521

[56] References Cited

U.S. PATENT DOCUMENTS

| | | | |
|---|---|---|---|
| 4,661,282 | 4/1987 | Clark | 423/593 |
| 4,764,357 | 8/1988 | Sherif et al. | 423/593 |
| 4,863,521 | 9/1989 | Block | 428/930 |
| 4,866,031 | 9/1989 | Bolt et al. | 505/1 |
| 4,880,770 | 11/1989 | Mir et al. | 505/1 |

OTHER PUBLICATIONS

Segal, Jour. Non-Cryst. Solids, 63 (1984) 183.
Nasu et al., in High Tc Superconductors II, ed. Capone II, Mrs. Apr. '88, p. 101.
J. Tarascon et al., High Temperature Superconducting Oxide Synthesis and the Chemical Doping of the Cu-O Planes ACS Symposium series 351, *Chemistry of High Temperature Superconductors*, p. 198 (1987).
T. Kumagai et al., Preparation of Superconducting $YBa_2Cu_3O_{7-d}$, Thin Films by the Dipping Pyrolysis Process Using Organic Acid Salts, Chem. Letters, p. 1645 (1987).
B. Dunn et al., Properties of Superconducting Oxides Prepared by the Amorphous Citrate Process, Adv. Ceramic Mat. 2:343 (1987).
G. Kordas et al., High Temperature Ceramic Superconductors Derived from the Sol-Gel Process. Mat. Let. 5:417 (1987).
C. Torardi et al., Structure-Property Relationships for $RBa_2Cu_3O_x$ Phases, ACS Symposium series 351, *Chem. of High Temp. Semiconductors*, p. 153, (1987).

*Primary Examiner*—Upendra Roy
*Attorney, Agent, or Firm*—William F. Boley

[57] ABSTRACT

A method is disclosed for preparation of superconductive substances, and in particular, those comprising a rar earth element, barium (Ba), copper (Cu) and oxygen, having a composition represented by the general formula: $LnBa_2Cu_3O_{7-\delta}$ in which Ln represents a rare earth element and $\delta$ has a value of about 0 to 0.5. The method includes forming a solution containing an organic compound of a rear earth element, an organic barium compound and an organic copper compound in an organic solvent, homogenizing the resulting solution, stripping the organic solvent from the homogenized solution by evaporation to give a precipitate and pyrolyzing the precipitate to obtain the superconductive substance. The precipitate may also be formed as fibers or films prior to pyrolysis.

17 Claims, No Drawings

PROCESS FOR PREPARING CERAMIC SUPERCONDUCTIVE SUBSTANCES

This is a continuation-in-part of copending application Ser. No. 07/254,636 filed on Oct. 7, 1988, now abandoned.

The present invention relates to a method for preparation of superconductive substances, and in particular, those comprising a rare earth element, barium (Ba) and copper (Cu) oxide, having a composition represented by the general formula:

$LnBa_2Cu_3O_{7-\delta}$ in which Ln represents a rare earth element selected from the group consisting of Y, La, Nd, Sm, Eu, Gd, Tb, Dy, Ho, Er, Tm, Yb and Lu and $\delta$ has a value of about 0 to 0.5.

BACKGROUND OF THE INVENTION

Sintered materials having a composition according to the formula $LnBa_2Cu_3O_{7-\delta}$ are already known as superconductive substances. Such sintered materials are produced from a powder mixture comprising an oxide of a rare earth element ($Ln_2O_3$), barium carbonate ($BaCO_3$) and copper oxide (CuO) by blending and milling the powder mixture, pre-sintering the resulting powder, again milling the pre-sintered product, press-shaping the resulting powder and sintering the shaped product.

However, the conventional powder process has the following problems:

(a) since an oxide or a carbonate is used as a starting material, the synthesized product often is nonhomogeneous and the removal of the impurities is difficult. Accordingly, superconductive substances having a high purity and a uniform composition were difficult to obtain, and superconductive substances with improved characteristics are needed, (b) in practice, because the process includes the sintering of a powder, the ability to shape the material is poor and it is difficult to obtain superconductive substances with a desired shape. In particular, it is extremely difficult to manufacture filmy or fibrous superconductive substances, and (c) the sintering step requires heating to relatively high temperatures, and the manufacturing costs are therefore high.

The present invention provides a method for preparing superconductive substances in shapes, which are difficult to manufacture by other conventional processes. In addition, superconductive substances of high purity can be produced by the method of the present invention.

SUMMARY OF THE INVENTION

The present invention provides a method for preparation of rare earth element-barium-copper oxide series superconductive substances having a composition according to the general formula:

$LnBa_2Cu_3O_{7-\delta}$ in which Ln represents a rare earth element selected from the group consisting of Y, La, Nd, Sm, Eu, Gd, Tb, Dy, Ho, Er, Tm, Yb, and Lu and $\delta$ has a value of about 0 to 0.5. The method comprises forming a homogeneous solution containing an organic compound of a rare earth element of Y, La, Nd, Sm, Eu, Gd, Tb, Dy, Ho, Er, Tm, Yb, or Lu, an organic barium compound and an organic copper compound in an organic solvent, stripping the organic solvent from the solution by evaporation to give a solid or semi-solid precipitate and pyrolyzing the precipitate to obtain the superconductive substance.

The three components (the rare earth element-containing organic compound, the organic barium compound and the organic copper compound) are mixed in the form of a solution of the three components in an organic solvent, so that the homogeneity of the resulting blend of the three components is substantially increased. In addition, the composition of the final superconductive substance can be readily controlled by adjusting the concentration of the components and the amount of the solution. Moreover, as the organic solvent is removed by evaporation, the resulting precipitate can be separated in a paste-like state having a viscosity appropriate for easy subsequent shaping processes. Accordingly, the paste-like precipitate can be shaped by appropriate means, so that the shape of the finally obtained superconductive substance can be controlled with great freedom. As a result, superconductive substances with high purity and formed in any desired shape including films, fibers, granules, and fine powders, can be manufactured easily and surely at low cost.

DETAILED DESCRIPTION OF THE INVENTION

In the method of the present invention, solutions of the organic metal compounds of rare earth element (selected from Y, La, Nd, Sm, Eu, Gd, Tb, Dy, Ho, Er, Tm, Yb, and Lu), barium, and copper can be prepared individually in organic solvents and then combined or the organic metal compounds can be dissolved in the same portion of organic solvent. The organic metal compounds include, for example, metal salts of carboxylic acids, metal alkoxides, metal ether compounds, metal amide compounds, metal organic chelate compounds and others. Preferred are those organic metal compounds where each organic substituent contains one to seven carbon atoms. More preferred are those organic metal compounds where each organic substituent contains one to five carbon atoms. Organic metal compounds represented by the formula $M^{n+}(OR)_n$, where R denotes an organic substituent and n is the oxidation state of the metal, are often preferred. Preferred organic metal compounds are metal alkoxides, for example, yttrium triisopropoxide and gadolinium triisopropoxide; metal ethers, for example, barium bis-2-ethoxyethoxide, barium bis-2-methoxyethoxide, and copper bis-2-ethoxyethoxide; metal salts of carboxylic acids, for example, barium diacetate; metal-organic chelates, for example, yttrium acetylacetonate and copper bis-acetylacetonate.

The organic metal compound itself can be dissolved directly in an organic solvent. Alternatively, the metal itself or another compound of the metal can be added to an organic solvent with which the metal or metal compound reacts to give a soluble organic metal compound. In this case, the resulting organic metal compound is formed in situ in the solvent and remains dissolved therein. Correspondingly, the combination of metal or metal compound and the organic solvent can also be used as a starting material in the method of the present invention. The presence of impurities in the solution is unfavorable, so that purification may be required.

The organic solvents useful in the preparation of the metal solutions are ones which can dissolve the rare earth element-, barium- or copper-containing organic compound to form the respective solution and which form homogeneous solutions comprising the metal-containing organic compounds by a homogenization treatment such as blending, stirring or the like. Examples of preferred organic solvents include hexamethyldisiloxane, benzene, toluene, pyridine, tetrahydrofuran, isopropyl alcohol, 2-methoxyethanol, 2-ethoxyethanol, dimethylformamide, dimethylsulfoxide, ethylene glycol-monoalkylether, ethylene glycol-dialkylether, acetylacetone, ethylenediamine and mixtures thereof. In particular, ethylene glycol-monoethylether, acetylacetone, and toluene-ethoxyethanol mixed solvent are preferably used. Especially useful are bidentate solvents like ether alcohols or beta diketones.

In the practice of the present invention, various means can be utilized for the preparation of the above-mentioned solutions containing three organic metal compounds. For example, there may be mentioned a method where the respective organic metal compounds are dissolved in the same or different miscible organic solvent(s) to form the respective solutions and these three solutions are blended; a method where two organic metal compounds are dissolved in the same organic solvent to form a solution, while the remaining one organic metal compound is dissolved in the same or a different miscible organic solvent to obtain another solution, and then the two separately prepared solutions are blended; and a method where the three organic metal compounds are dissolved in the same organic solvent either simultaneously or sequentially to obtain a solution containing the three organic metal compounds.

In each of the above-mentioned means, the selection of the organic solvents which are to be used is important in practice. Specifically, the solvents must be capable of sufficiently dissolving the intended organic metal compounds and additionally be sufficiently miscible with other solvents when two or more different solutions are blended. In practice, a good solvent for the organic copper compound is also often capable of dissolving both the rare earth element-containing organic compound and the organic barium compound and therefore may be used to dissolve all three organic metal compounds.

In the case when the solution containing all three organic metal compounds is prepared by blending plural solutions each containing the respective organic metal compound individually, the concentration and the amount of the respective solutions are not critical in the practice of the present invention, so long as the solutions are combined to provide a molar ratio of rare earth element/barium/copper of 1/2/3 in the final superconductive substance. Accordingly, the maximum soluble amount of the intended organic metal compound in the organic solvent to be used may first be experimentally determined, and the amounts of the other organic metal compound and organic solvent can be determined on the basis of the previously obtained experimental data. In general, the actual concentration of each of the organic metal compounds varies from about $10^{-1}$ to about $10^{-3}$ mol/L.

The homogenization of the solutions containing the above-mentioned three organic metal compounds dissolved therein is important so as to facilitate copolycondensation reactions of these organic metal compounds, which is necessary to obtain the desired superconductive substance. The homogenization of the solutions can be attained by stirring the solutions together at normal temperature or under heat, for example under reflux for about from 2 to 5 hours. In practice, any homogenization is sufficient which upon further processing according to the instant invention, produces a substance of the formula $LnBa_2Cu_3O_{7-\delta}$. If desired, homogenization can be accelerated by stirring for a longer period of time under heat, so long as such heating does not promote reduction of the copper in the solution and corresponding separation of $Cu_2O$.

Prior to or during the homogenization, water may be added, although not always necessary, in an amount of from $\frac{1}{4}$ to 4 equivalents, whereby product having a higher polymerization degree can be obtained. Although co-reaction of the metal compounds is not necessary during the homogenization process, it is generally preferred that such co-reaction be facilitated as far as possible during the homogenization process. Such co-reaction may be facilitated, for example, by the addition of water.

Next, the organic solvent is stripped by evaporation from the homogeneous solution. In this solvent-stripping step, the solution is gradually concentrated to cause the separation of a precipitate. With further removal of the solvent, the precipitate becomes paste-like or solid. The solvent may be removed, for example, by first subjecting the solution to a reduced pressure treatment (several millimeters mercury) at room temperature for about 4 to 5 hours so that the solution is concentrated from the initial concentration to a relatively high concentration, and secondly, subjecting the concentrated solution to a vacuum drying treatment at room temperature or under gentle heat until a solid precipitate is formed. Following the solvent-stripping step, the pyrolyzing treatment is carried out, and therefore, it is preferred that the organic solvent in the resulting precipitate be removed as thoroughly as possible by evaporation.

After the completion of the solvent stripping-step or during the step, a paste-like precipitate may also be separated. Such a precipitate is fluid and somewhat viscous, and can be formed into a desired shape. For instance, the precipitate can be coated over the surface of a support so as to form a filmy product, or alternatively, this can be spun by an appropriate means to provide a fibrous product. Accordingly, since the precipitate of the present invention can be easily formed into a desired shape, superconductive substance can likewise be produced in any desired shape.

In the shaping step, the support on which the precipitate composition is to be coated is not specifically limited but can, for example, be selected from zirconium materials, titanium materials, ceramic fibers, copper, platinum, ceramics such as magnesia, sapphire, zirconia, strontium titanate, etc. Regarding the means of spinning the precipitate to fibers, there may be mentioned a method where a spinnable product obtainable from the precipitate is drawn up and spun to give fibers, and a method where the precipitate is extruded into a spinning solution having a function of extracting the organic solvent that remains in the precipitate to give fibers. To facilitate the shaping step, it is possible to control the reaction time so as to adjust the viscosity of the precipitate or to introduce some polymerizable functional group(s) into the organic metal compounds so as to elevate the degree of polymerization of the product, whereby fibrous superconductive substances having a high strength can be obtained.

The above-mentioned shaping step is not indispensable in the method of the present invention. Accordingly, if the intended form of the superconductive substance does not specifically require the shaping step, it can be omitted, and the precipitate obtained in the solvent-stripping step can be directly subjected to pyrolysis. Even when the shaping step has been carried out, if organic solvent still remained in the shaped body, any additional step of further stripping the organic solvent can of course be effected.

The solid or semi-solid precipitate is subsequently subjected to pyrolysis. The pyrolysis process comprises the following three stages.

(1) Pyrolysis of Residual Organic Materials

In general, the precipitate composition still contains organic solvent(s), which have not been completely stripped, and in addition, may further contain some by-products such as alcohol. The treatment at this stage is intended to remove these organic materials, for example, this stage of the pyrolysis treatment is effected by heating the composition in air, nitrogen, or an oxygen gaseous stream, at a relatively low temperature of 500° C. or lower, for several hours or so.

In general, for example, it is sufficient to first treat the composition in dry air at 400° C. for 1 hour and then further treat it in oxygen gas at 500° C. for 2 hours.

(2) Crystallization Treatment of Precipitate

The purpose of this treatment is to crystallize the precipitate or to elevate the crystallinity of the composition. For example, this can be effected by heating the composition in an oxygen gas at a temperature higher than the temperature of the first pyrolysis stage, for example, at a temperature of 900° C., for 3 to 4 hours. If the temperature is lower, a longer time at the temperature is required. It is necessary to carry out the pyrolysis in an oxygen atmosphere so that the final solid product has a composition corresponding to the formula $LnBa_2Cu_3O_{7-\delta}$ and is free from oxygen defects. The atmospheric gas need not be limited to only oxygen. Other atmospheres such as ozone, air with an elevated oxygen content, air, and other oxygen-containing gas mixtures can also be used.

(3) Annealing Treatment

After completion of second treatment step, the product is gradually cooled in the oxygen gas to about 400° C. and thereafter immediately transferred to a dry atmosphere and cooled to room temperature, whereby the annealing treatment is completed. The purpose of this treatment is to lower oxygen vacancies which occur in the composition during the high temperature pyrolysis. Practically, it is preferred to cool the composition in oxygen gas from 500° C. to 300° C. at a cooling speed of about 100° C./h and then it may be more rapidly cooled. Alternatively, the composition can be cooled under normal conditions and then re-heated in an oxygen-containing atmosphere at a relatively low temperature, for example, at 400° C. to 600° C. or so. The re-heating treatment can be omitted, if the above-mentioned annealing treatment is sufficient. Thus, the proportion of oxygen defects in the composition can be remarkably reduced, by an appropriate cooling sequence.

After the pyrolysis step, a black solid product is generally obtained. This solid product is a superconductive substance which exhibits superconductivity at a relatively high temperature. In addition, when the precipitate composition is shaped prior to the pyrolysis step, the shape of the composition can be maintained during pyrolysis so that a shaped superconductive substance is obtained. For example, when the precipitate composition is shaped into films or fibers, filmy or fibrous superconductive substances can be obtained. Obviously, a fine powdery superconductive substance is obtained when the precipitate composition is pyrolyzed without further shaping.

In accordance with the present invention, superconductive substances which have an extremely high purity and which have been formed into a desired shape can be readily and reliably obtained at a low manufacture cost.

Next, the present invention will be explained by reference to examples, which, however, are not intended to limit the scope of the present invention.

EXAMPLE 1

Barium metal was dissolved in ethylene glycol monoethylether (hereinafter referred to as "EGME"), to prepare 100 mL of EGME solution containing 0.002 mol of barium. 550 mL of EGME solution containing 0.003 mol of copper bisacetylacetonate was added to the barium solution. Next, 300 mL of EGME solution containing 0.001 mol of yttrium triisopropoxide was added to the resulting solution, and the whole was stirred for 3 hours at room temperature, to obtain a homogenized solution. The solution was then treated under a reduced pressure of several millimeters mercury for about 4 hours to evaporate EGME. The solution was concentrated to 35 mL of a green solution. The concentrated solution was further subjected to vacuum drying to obtain a green paste-like precipitate composition. The precipitate composition could be easily shaped.

The precipitate composition was heated in air at 500° C. for 1 h, in oxygen gas at 930° C. for 3 h and then in oxygen gas at 450° C. for 2 h in order, and thereafter was rapidly cooled in a dry atmosphere at 25° C. A black solid was produced by this pyrolysis treatment. X-ray diffraction analysis of the solid confirmed a composition according to the formula $LnBa_2Cu_3O_{7-\delta}$.

The solid was cooled to a temperature of 87 K. and the electric resistance was measured to be 0 (zero), which indicates that the solid shows superconductivity at 87 K.

EXAMPLE 2

The procedure of Example 1 was repeated, except that gadolinium triisopropoxide was used in place of the yttrium triisopropoxide. A solid product having a composition of the formula $GdBa_2Cu_3O_{7-\delta}$ was obtained. This solid product was also found to have the same electroconductivity as that obtained in Example 1.

EXAMPLE 3

0.0934 g of yttrium triisopropoxide was dissolved in 500 mL of 2-ethoxyethanol, 0.0964 g of barium metal was added thereto and dissolved, and further, 2.45 mL of a toluene solution containing a compound of a formula:

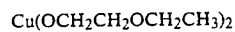

in an amount of 0.584 mol/L was added to the solution. Then, 2-ethoxyethanol was added to make 1000 mL in all.

500 mL of the solution was stirred under reflux at a temperature of about 80° C. for 12 h (the period being sufficiently longer than the time necessary for homogenization of the solution), and then 20.58 μL (¼ equivalent) of water (H$_2$O) was added thereto and the whole was heated for a further 5 h at about 80° C.

A platinum plate was dipped in the solution and drawn up. The plate was subjected to vacuum drying under a reduced pressure of several millimeters mercury for about 4 h. Next, it was heated in an oxygen gas at 200° C. for 3 h, at 850° C. for 12 h, at 920° C. for 12 h and then at 550° C. for 5 h in order. Afterwards, it was rapidly cooled by dipping in liquid nitrogen, to obtain a black film.

By X-ray diffraction analysis, the film was found to have a composition according to the formula YBa$_2$Cu$_3$O$_{7-\delta}$.

The film was cooled to a temperature of 90 K. and the electric resistance was measured to be 0 (zero), which indicates that the film exhibits the Meissner effect at 90 K.

EXAMPLE 4

0.133 g (0.5 mM) of yttrium triisopropoxide, 0.137 g (1.0 mM) of barium metal and 0.393 g (1.5 mM) of copper acetylacetonate were added to 500 mL of 2-methoxyethanol, which had been dried with molecular sieves and dissolved therein. The resulting blue solution was gently heated under reflux in a dry atmosphere with reduced pressure to strip the solvent, whereupon the solution became a green waxy substance.

This substance was first heated in air at 40° C. for 2 h and then in an oxygen gas at 950° C. for 4 h. Afterwards, it was cooled to 700° C. in oxygen gas and annealed for 16 h, and then further gradually cooled to room temperature over 1.5 hours or more.

The resulting substance was analyzed by X-ray diffraction, and found to be consistent with the formula LnBa$_2$Cu$_3$O$_{7-\delta}$ which is characteristics of superconductive substances.

In the above process, a green solution from which the solvent had not been completely stripped was spun to obtain a fibrous substance. In addition, a glass base was dipped in a solution which contained a still larger amount of the solvent than the above solution, and as a result, a bluish green film was formed on the surface of the glass base.

EXAMPLE 5

The procedure of Example 4 was repeated, except that 0.1939 g (0.5 mM) of yttrium acetylacetonate was used in place of the yttrium triisopropoxide. As a result, a substance having the same composition as that of Example 4 was obtained.

EXAMPLE 6

1.064 g (4 mM) of yttrium triisopropoxide, 1.099 g (8 mM) of barium metal and 3.1413 g (12 mM) of copper bisacetylacetonate were added to 1 L of 2-methoxyethanol and dissolved therein. 400 cc of the solution was subjected to reflux at reduced pressure in the same manner as Example 4 to strip the solvent, and then 25 cc of the solvent was added thereto. The resulting solution had 21 mM of a hydrolyzable group. To the solution was added 3 cc of ammonium hydroxide containing about 100 mM of water (corresponding to about 5 times amount of hydrolyzable groups) for hydrolysis. The solution was dried and pelletized and then heat-treated in the same manner as Example 4, whereby a superconductive substance exhibiting the Meissner effect in liquid nitrogen was obtained.

EXAMPLE 7

Barium metal (10 mM) and copper bisacetylacetonate (15 mM) were dissolved in 100 mL of dry 2-methoxyethanol. Water (1.1 g) and cyclohexylamine (11.4 cc) were added to the solution. Then yttrium triisopropoxide (5 mM) was added to the solution. The solution was vacuum stripped to near dryness. Fibers of several centimeter length and about 10 micrometer diameter were drawn from the concentrated solution. Fibers were pyrolyzed at 950° C. in oxygen, then annealed at 450° C. in oxygen and finally cooled rapidly to room temperature. The fibers retained their shape after the pyrolysis treatment. This experiment illustrates the ability to form the precursor solution or precipitate into fibers and convert them to superconductive material.

That which is claimed is:

1. A method for preparation of superconductive substances having compositions represented by the general formula:

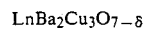

$$LnBa_2Cu_3O_{7-\delta}$$

in which Ln represents a rare earth element selected from the group consisting of yttrium and gadolinium and δ has a value of about 0 to 0.5, which method comprises, forming a solution containing an organic compound of a rare earth element selected from the group consisting of yttrium triisopropoxide, yttrium acetylacetonate, and gadolinium triisopropoxide; an organic barium compound selected from the group consisting of barium carboxylic acid salts, barium ether compounds, barium chelates, and barium amides; and an organic copper compound selected from the group consisting of copper carboxylic acid salts, copper ether compounds, copper chelates, and copper amides; in an organic solvent, wherein each organic substituent of the organic barium compound and the organic copper compound contains one to five carbon atoms, homogenizing the resulting solution, stripping the organic solvent from the homogenized solution by evaporation to give a precipitate and pyrolyzing the precipitate to obtain the superconductive substance.

2. A method for preparation of superconductive substances as claimed in claim 1, which further comprises shaping the precipitate during or after stripping the organic solvent from the homogenized solution.

3. A method for preparation of superconductive substances as claimed in claim 1 wherein the organic solvent is selected from the group consisting of methoxyethanol, ethoxyethanol, acetylacetone, and mixtures of toluene and methoxyethanol, ethoxyethanol, or acetylacetone.

4. A method for preparation of superconductive substances as claimed in claim 1 wherein during the homogenization of the solution, water is added to the solution in an amount of 0.25 to 4 equivalents based on metal compounds.

5. A method for preparation of superconductive substances as claimed in claim 1 wherein the precipitate is pyrolyzed at a temperature of 900° C. or above in an atmosphere containing oxygen.

6. A method for preparation of superconductive substances as claimed in claim 1 wherein the organic copper compound is selected from a group consisting of copper bis-acetylacetonate and copper bis-2-ethoxyethoxide.

7. A method for preparation of superconductive substances as claimed in claim 2 wherein the precipitate is shaped into a fiber after stripping organic solvent from the homogenized solution.

8. A method for preparation of superconductive substances as claimed in claim 6 wherein the organic barium compound is selected from a group consisting of barium diacetate, barium bis-2-ethoxyethoxide and barium bis-2-methoxyethoxide.

9. A method for preparation of superconductive substances having compositions represented by the general formula:

$$LnBa_2Cu_3O_{7-\delta}$$

in which Ln represents a rare earth element selected from the group consisting of Y, La, Nd, Sm, Eu, Gd, Tb, Dy, Ho, Er, Tm, Yb and Lu and $\delta$ has a value of about 0 to 0.5, which method comprises,
forming a solution containing an organic compound of a rare earth element of Y, La, Nd, Sm, Eu, Gd, Tb, Dy, Ho, Er, Tm, Yb or Lu, an organic barium compound and an organic copper in an organic solvent,
wherein the organic compound of the rare earth element is selected from the group consisting of rare earth metal ether compounds, rare earth metal chelates, and rare earth metal amides; wherein the organic barium compound is selected from the group consisting of barium ether compounds, barium chelates, and barium amides; and wherein the organic copper compound is selected from the group consisting of copper ether compounds, copper chelates, and copper amides,
homogenizing the resulting solution,
stripping the organic solvent from the homogenized solution by evaporation to give a precipitate and pyrolyzing the precipitate to obtain the superconductive substance.

10. A method for preparation of superconductive substances as claimed in claim 9 wherein the organic barium compound is a barium ether compound.

11. A method for preparation of superconductive substances as claimed in claim 9, which further comprises shaping the precipitate during or after stripping the organic solvent from the homogenized solution.

12. A method for preparation of superconductive substances as claimed in claim 9 wherein the organic solvent is selected from the group consisting of methoxyethanol, ethoxyethanol, acetylacetone, and mixtures of toluene and methoxyethanol, ethoxyethanol, or acetylacetone.

13. A method for preparation of superconductive substances as claimed in claim 9 wherein during the homogenization of the solution, water is added to the solution in an amount of 0.25 to 4 equivalents based on metal compounds.

14. A method for preparation of superconductive substances as claimed in claim 9 wherein the precipitate is pyrolyzed at a temperature of 900° C. or above in an atmosphere containing oxygen.

15. A method for preparation of superconductive substances as claimed in claim 10 wherein the barium ether compound is barium bis-2-ethoxyethoxide.

16. A method for preparation of superconductive substances as claimed in claim 10 wherein the barium ether compound is barium bis-2-methoxyethoxide.

17. A method for preparation of superconductive substances as claimed in claim 11 wherein the precipitate is shaped into a fiber after stripping organic solvent from the homogenized solution.

* * * * *